United States Patent
Chang et al.

(10) Patent No.: US 7,321,139 B2
(45) Date of Patent: Jan. 22, 2008

(54) TRANSISTOR LAYOUT FOR STANDARD CELL WITH OPTIMIZED MECHANICAL STRESS EFFECT

(75) Inventors: Mi-Chang Chang, Hsinchu (TW); Liang-Kai Han, Hsinchu (TW); Huan-Tsung Huang, Puli Township, Nantou County (TW); Wen-Jya Liang, Hsin-Chu (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/441,557

(22) Filed: May 26, 2006

(65) Prior Publication Data

US 2007/0284618 A1   Dec. 13, 2007

(51) Int. Cl.
*H01L 27/10* (2006.01)
*H01L 29/739* (2006.01)
*H01L 29/73* (2006.01)
*H01L 29/74* (2006.01)
*H01L 31/062* (2006.01)

(52) U.S. Cl. .................. 257/202; 257/203; 257/204; 257/205; 257/206; 257/207; 257/208; 257/209; 257/210; 257/211; 257/401

(58) Field of Classification Search ........ 257/202–211, 257/401
See application file for complete search history.

(56) References Cited

U.S. PATENT DOCUMENTS

| | | | | |
|---|---|---|---|---|
| 5,619,420 A * | 4/1997 | Breid | ............................ | 716/8 |
| 5,789,774 A * | 8/1998 | Merrill | ....................... | 257/292 |
| 6,635,935 B2 * | 10/2003 | Makino | ....................... | 257/369 |
| 6,703,641 B2 * | 3/2004 | Kane et al. | ................... | 257/48 |
| 7,019,380 B2 * | 3/2006 | Sanuki | ....................... | 257/513 |
| 7,064,453 B2 * | 6/2006 | Sato | ........................... | 257/202 |
| 7,196,377 B2 * | 3/2007 | Kodama et al. | ............ | 257/355 |
| 7,208,803 B2 * | 4/2007 | Ting | ............................ | 257/408 |
| 7,217,966 B1 * | 5/2007 | Vashchenko et al. | ....... | 257/210 |
| 2007/0001237 A1 * | 1/2007 | King et al. | ................. | 257/401 |
| 2007/0202652 A1 * | 8/2007 | Moroz et al. | ............... | 438/296 |

* cited by examiner

Primary Examiner—Ida M. Soward
(74) Attorney, Agent, or Firm—K & L Gates LLP (57) ABSTRACT

A layout for a transistor in a standard cell is disclosed. The layout for a transistor includes an active region with at least one portion having a first edge and at least one portion having a second edge all perpendicular to a channel of the transistor; and a gate placed on top of the active region with a distance from an edge of the gate to the first edge being shorter than a distance from the edge of the gate to the second edge of the active region, wherein the active region is of a non-rectangular shape.

14 Claims, 14 Drawing Sheets

TRANSISTOR LAYOUT FOR STANDARD CELL WITH OPTIMIZED MECHANICAL STRESS EFFECT

BACKGROUND

The present invention relates generally to semiconductor designs, and more particularly to a cell library design that optimizes mechanical stress effect.

In semiconductor, it is generally understood that the terms "stress" and "strain" should not be used interchangeably. These terms are, in fact, mechanical engineering or physics terms that correspond to very different properties. Stress is a set of forces applied to a body. On the other hand, strain is the response of the body as deformation, in which energy is stored. This energy is released when the stress is released or when the body fails, such as by cracking. In the field of engineering science, scientists often use Young's modulus, which is the ratio of stress to strain, as a defining quantity for a given material.

The mobility of current carriers, electrons or holes, in semiconductors changes as stress is applied to the material. The material crystal is strained, or deformed. "Strained silicon" becomes more relevant as integrated circuit (IC) structures become ever smaller. There are many structures in ICs that accidentally or purposely induce local strain. Depending upon situations, this can be a problem or an advantage. One strain-inducing structure in a semiconductor device is the border between the active region of a transistor and the shallow trench isolation (STI) surrounding it. STI oxide grown on silicon occupies more volume than the original silicon consumed. The difference causes strain as the oxide tries to push the adjoining silicon out of the way.

Strain, on the other hand, diminishes rapidly with distance. The structure that exhibits electrical effects from the strain is the gate channel. Current carrier mobility is changed in strained silicon, and that changes the saturation current I_Dsat.

In semiconductor circuit design, a standard cell is pre-designed and called from a design library for any particular application. Such a standard cell has its own configuration and layout design determined so that they conform to certain design rules. The use of such standard cell is widely accepted.

What is therefore needed in the field of semiconductor design is a set, or library, of preset standard cells for transistors that require little design time or effort to achieve maximum benefit from strained semiconductor material.

SUMMARY

In view of the foregoing, the following provides various area-efficient layout designs for transistors for a standard cell that seek the maximum benefits from strained semiconductor material.

In various embodiments, layouts for a transistor in a standard cell are disclosed. For example, the layout for a transistor can comprise an active region with at least one portion having a first edge and at least one portion having a second edge all perpendicular to a channel of the transistor; and a gate placed on top of the active region with a distance from an edge of the gate to the first edge being shorter than a distance from the edge of the gate to the second edge of the active region, wherein the active region is of a non-rectangular shape.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 5A-10 illustrate various transistor layouts in accordance with the various embodiments of the present invention.

DESCRIPTION

The following will provide a detailed description of certain area-efficient standard cells for transistor designs that seek the maximum benefits from strained semiconductor material. It is realized that a greater distance between the edge of the STI and the edge of the poly gate reduces the effect of strain. Therefore, a structure that applies stress that produces beneficial electrical effects, in a material that is therefore strained, should be placed closely to the gate, or other structure that benefits from strain. A structure that applies stress that produces detrimental electrical effects, in a material or structure that is therefore strained should be placed distantly from the gate, or other structure that suffers from strain. Since some stresses are beneficial and others are detrimental, the distance between the stress-inducing structure and the gate needs to be carefully designed for optimizing the transistor performance.

Figure 1:
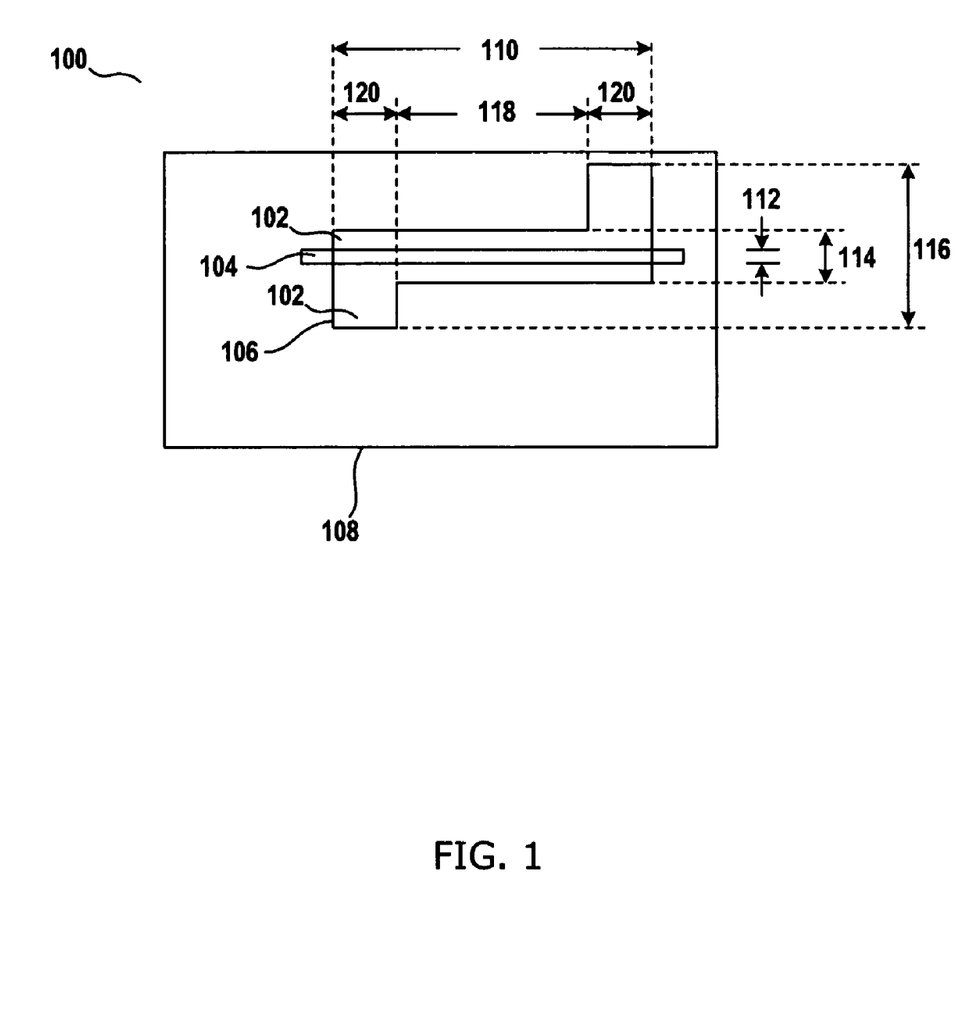
FIG. 1 illustrates a semiconductor layout in accordance with the present invention.

FIG. 1 illustrates a semiconductor layout 100 of a MOS transistor for a standard cell in accordance with one embodiment of the present invention. A Z-shaped active region 102 of a MOS transistor is underneath a polysilicon (poly) gate 104, which may extend slightly over an edge 106 thereof into a surrounding isolation structure such as a shallow-trench-isolation (STI) 108 on both ends. The poly gate 104 has a channel length 112 and an effective width 110. It is noted that the length 112 and width 110 are designated according to the convention of semiconductor industry.

In any practical MOS transistor, the width 110 of the poly gate 104 is significantly greater than the length 112 of the poly gate 104 with its current conducting channel underneath. The length 112 of the poly gate 104 is centered in a minor length 114 of the active region 102, and in a major length 116 of the active region 102 of the transistor. A portion 118, of the width 110 of the active region 102, has the minor effective length 114 of the active region 102. The portions 120, of the active region 102, have the length 116 of the active region 102 collectively.

In short, the Z-shaped active region 102 has a total width 110, which is the summation of the portion 118, and the two portions 120. The total width 110 of the active region 102 is also the functional width of the poly gate 104. The slight extension of the poly gate 104 over the edge 106 of the STI 108 is nonfunctional. The length 112 of the poly gate 104 is slightly longer than the current carrying channel length underneath. The channel underneath is slightly shorter due to the slight diffusion of the source and the drain under the edges.

In current design practice, a library of standard optimized transistor cells are typically predefined and used multiple times in design applications. Modeling programs, such as SPICE, can simulate the characteristics of the circuit designs based on the predetermined cells used. While laying out the standard cells, there are geometric concerns. Concessions are made due to the effects of applied stress that produces strain in the semiconductor material.

Figure 2A:
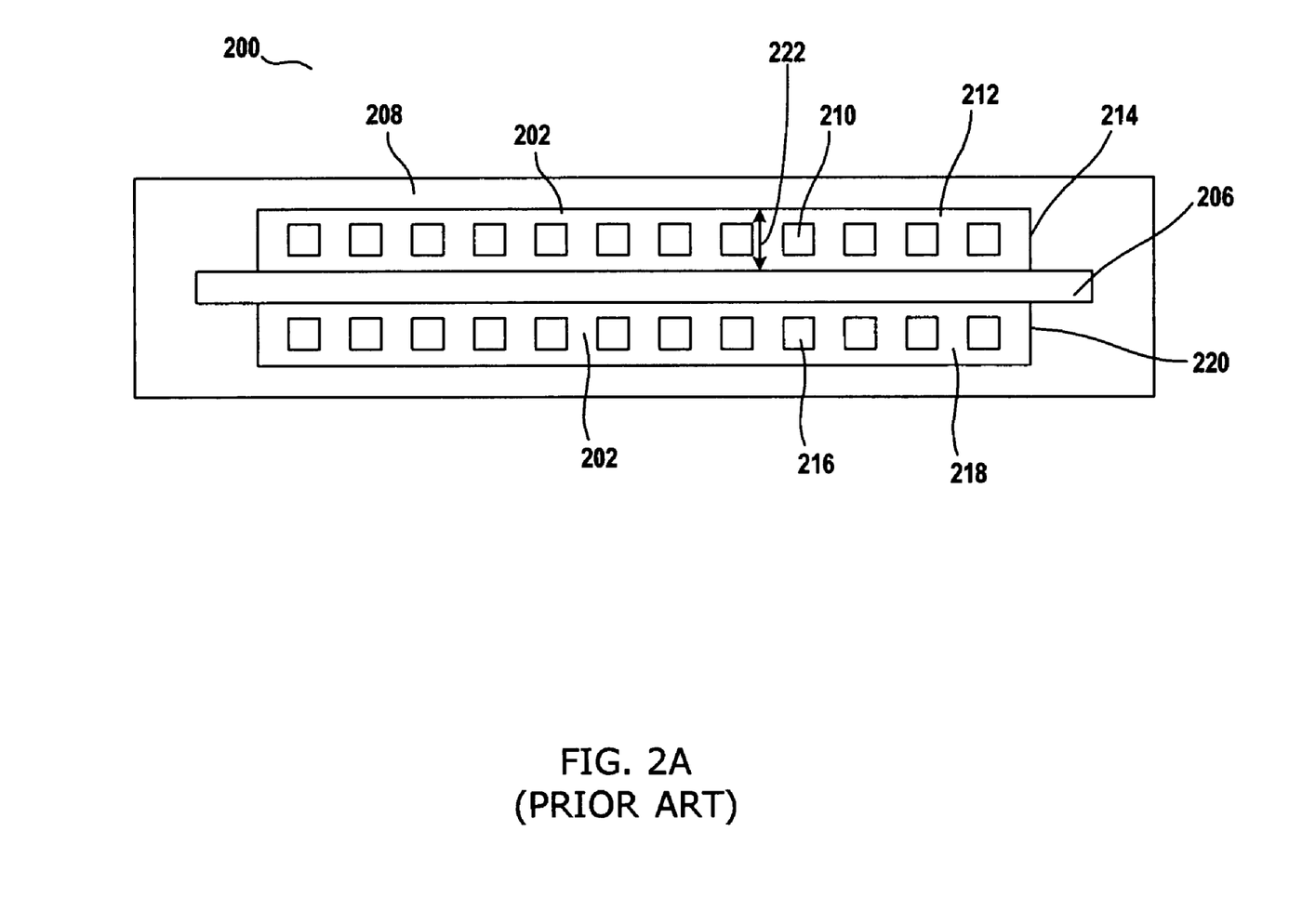
FIG. 2A illustrates a conventional transistor design.

FIG. 2A illustrates a typical standard cell MOS transistor design layout 200. An active region 202 of a MOS transistor is layered with a poly gate 206, which extends slightly over the surrounding area of a STI 208 on both ends. Multiple source contacts 210 are placed within a source diffusion area 212 that covers an active region portion 214 on one side of the poly gate 206. Multiple drain contacts 216 are placed within a drain diffusion area 218 that covers another active region portion 220 on the other side of the poly gate 206. A distance 222, in the current conducting direction, spans from the near edge of the poly gate 206 to the edge of the active region or the beginning edge of the STI 208.

Figure 2B:
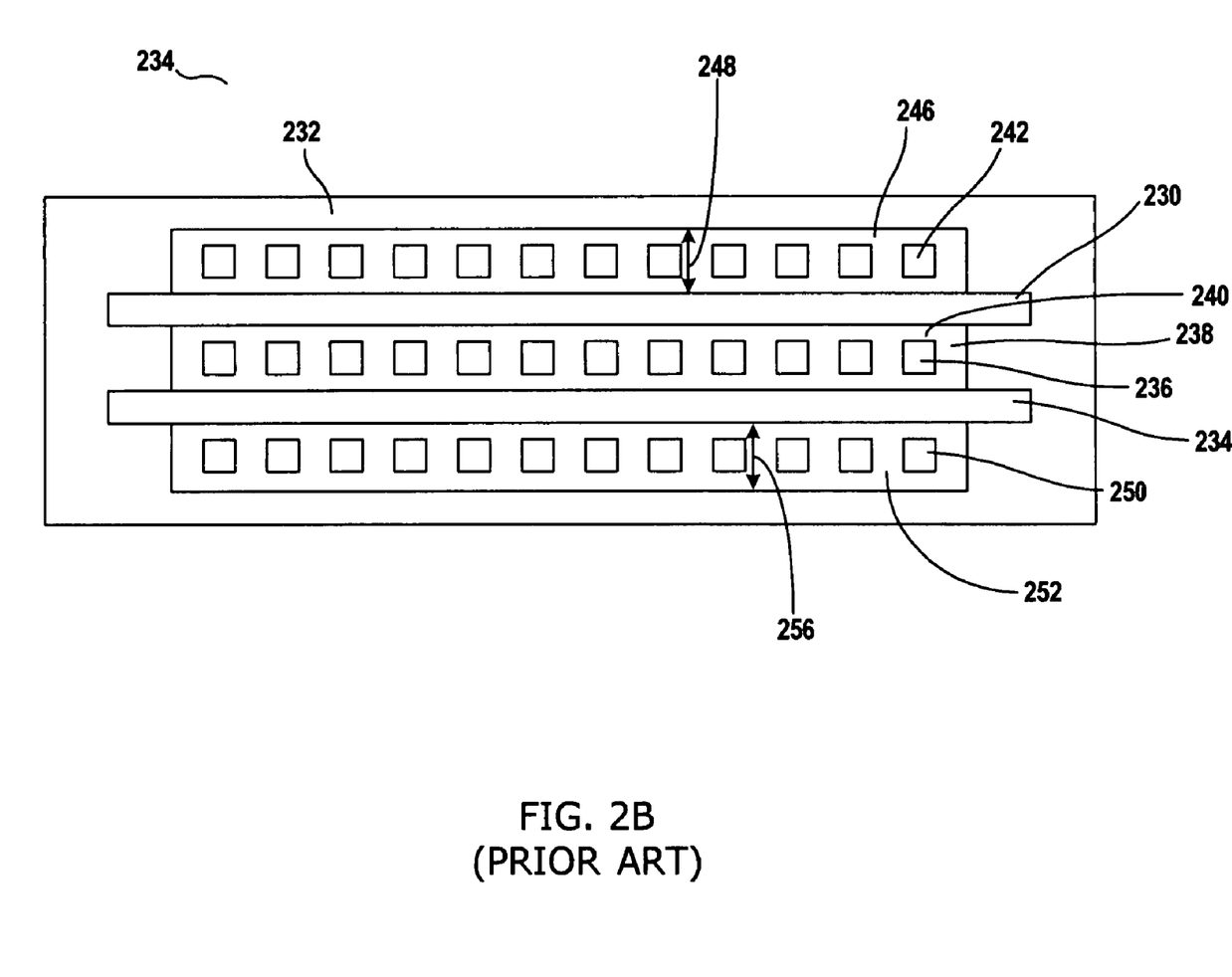
FIG. 2B illustrates another conventional transistor design.

FIG. 2B illustrates another typical MOS transistor design layout 234. An active region of the MOS transistor is layered with a poly gate 230, which extends slightly to the surrounding area of a STI 232 on both ends. The active region of the MOS transistor is also layered with another poly gate 234, which also extends slightly to the surrounding area of the STI 232 on both ends. Multiple source contacts 236 are placed within a source diffusion area 238 that covers an active region portion 240 between the poly gate 230 and the poly gate 234. Multiple drain contacts 242 are placed within a drain diffusion area 246, which is the active region bridging the poly gate 230 and the STI 232. A distance 248, in the current conducting direction, spans from the near edge of the poly gate 230 to the edge of the active region or STI 232. Multiple drain contacts 250 are placed within a drain diffusion area 252 that covers the active region portion between the poly gate 234 and the STI 232. A distance 256, in the current conducting direction, spans from the near edge of the poly gate 234 to the edge of the active region or STI 232. This configuration provides two transistors coupled together sharing one diffused region together. It is understood that the source and drain regions can be reversed.

Different from the above conventional configurations, this invention proposes various embodiments to improve strained silicon performance by reducing the distance 222, 248, or 256 in order to provide the optimal stress effect. Traditionally, great experimental effort is required to produce structures that even survive the effects of stress in a given design. Here, some ordered design examples are shown. These designs exhibit a consistent progression of effects so that the standard cells can be appropriately designed.

FIGS. 3A to 3F illustrate MOS transistor design layouts 300, 302, 304, 306, 308, and 310 with variations of the length in portions of strain-inducing active region that is near to the gate, in accordance with the present invention.

The poly gate 312 is centered, in the current conducting direction, between edges 314 shared by the STI and the active region 316. The poly gate 312 has an active width 318. In all cases, the width 318 of the poly gate 312 is also the width 318 of the active region 316. The poly gate 312 has a length 320, in the current conducting direction.

With regard to FIGS. 3B to 3F, the portion(s) 326, of the active region 316, has the minor length 322 of the active region 316. The portion(s) 328 of the active region 316 has the major length 324 of the active region 316. The terms "major length" and "minor length" are used to identify the variations of the length along the width of the active region. From another perspective, although the edges of the portion 328 and portion 326 are all parallel and perpendicular to the channel of the transistor, they are designed to have a different distance to the edge of the gate 312. The concept is to reduce the distance from the gate edges to the edges of the active region in some portions of the active region while not interfering with the functionality of the transistor. As shown, the portions having a minor length are the places where the distance between the gate edge and the edge of the active region is reduced from the major length of the rest of the active region. The locations where the active region may have a minor length can vary and one reason to keep some portions of the active region to have a major length is to place contacts there as needed for the transistor design.

Figure 3A:
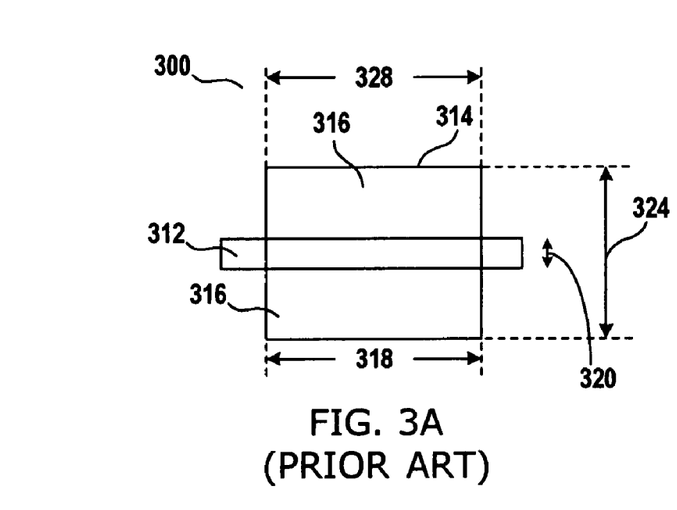
FIGS. 3A to 3F illustrate transistor designs in accordance with various embodiments of the present invention.
Figure 3B:
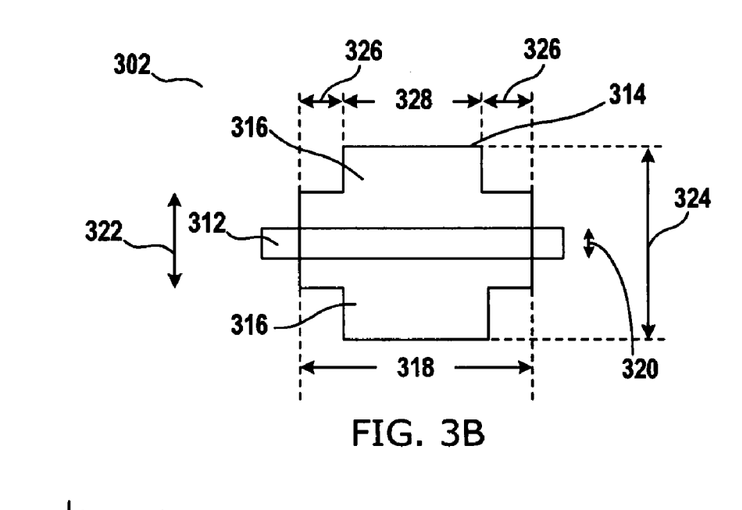
Figure 3C:
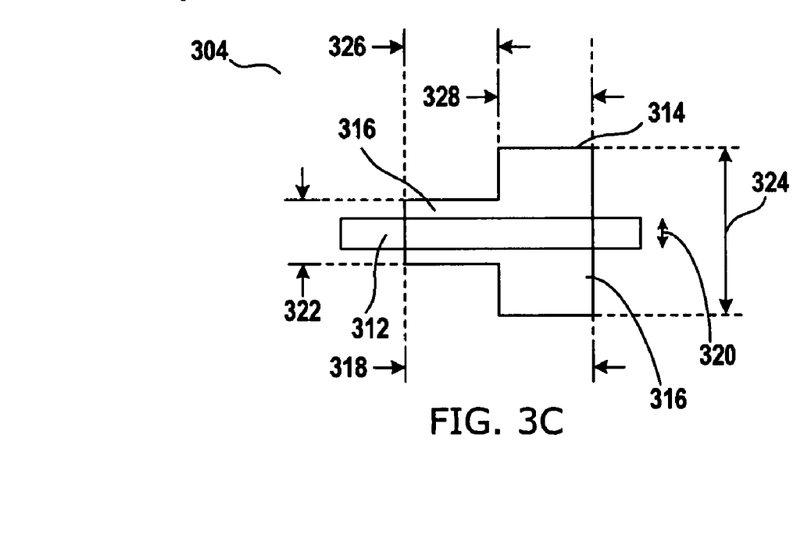
Figure 3D:
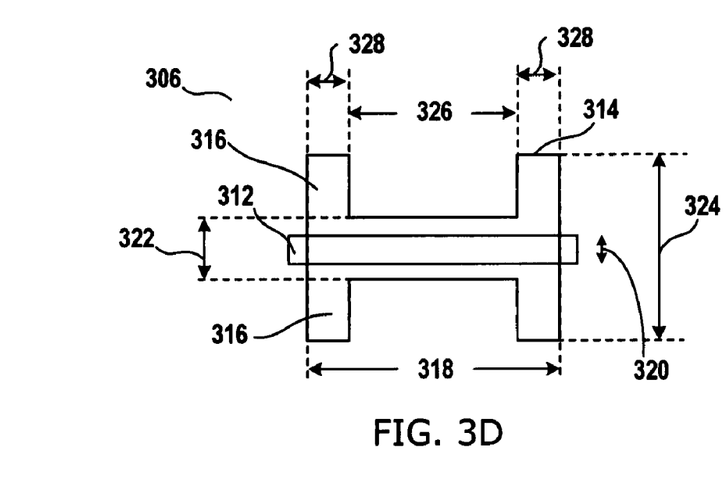
Figure 3E:
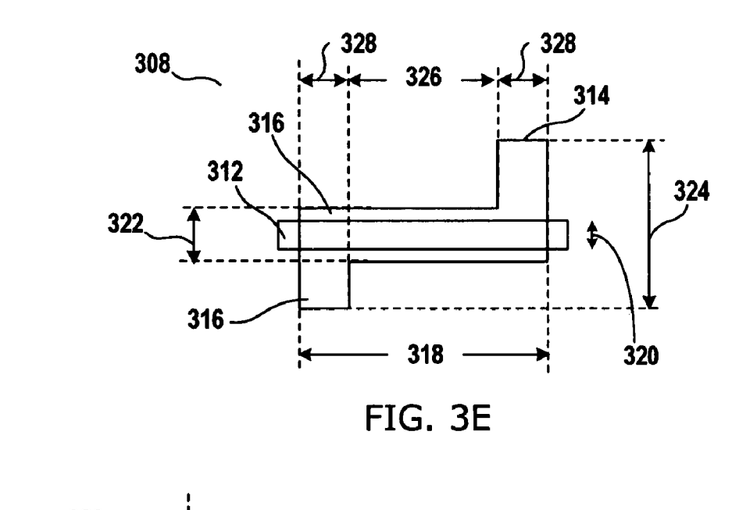
Figure 3F:
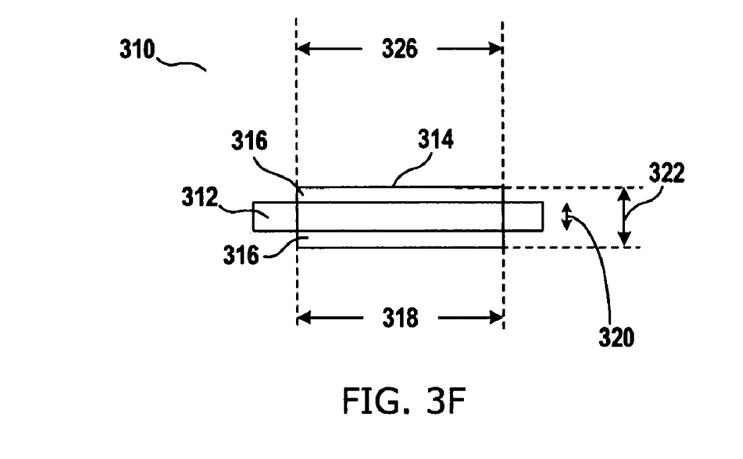

Mathematically, the ratio, W, of the total width of the portion(s) 326 to the total width 318 of the active region 316 can be used to represent the non-rectangular active region with some portions of that having a "reduced" minor length with respect to the major length. As a comparison, in FIG. 3A, the ratio W is zero as the active region is a conventional rectangular one. In FIGS. 3B, 3C, and 3D, the ratio W is roughly 0.5. In FIG. 3E, the ratio W is about 0.75. In FIG. 3F, the ratio W is 1.0 as the whole active region is reduced in its normal length. It is understood that the larger the ratio W, the better performance for building certain transistors using the strained silicon.

Figure 4A:
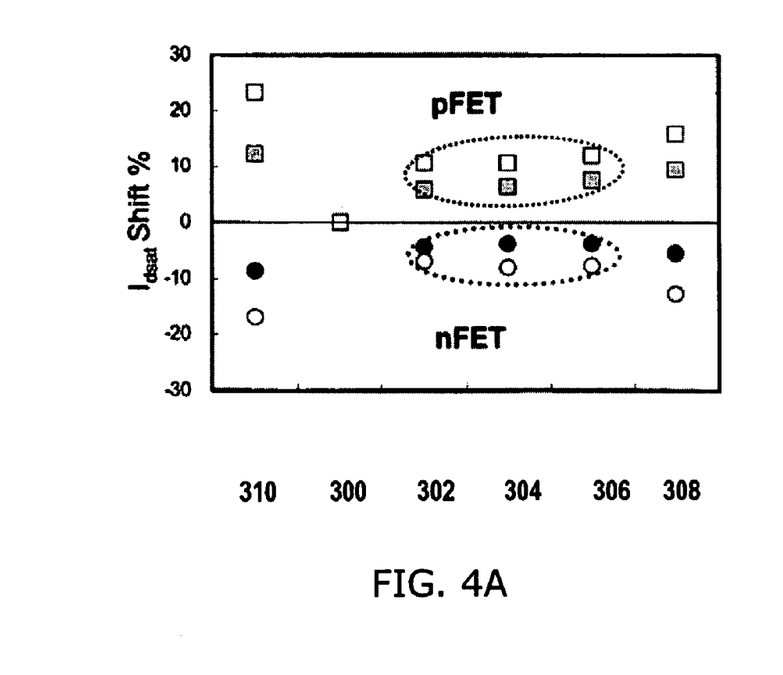
FIGS. 4A-4B illustrate the effects improved design for the active region on I_Dsat in accordance with the present invention.

FIG. 4A illustrates the effects of the designs similar to those in FIGS. 3A to 3F on I_Dsat in accordance with the present invention. The variations of I_Dsat corresponding to the design layouts 310, 300, 302, 304, 306, and 308 are represented from left to right. The device in FIG. 3A (or point 300) is taken as the reference point, with zero variation for both PMOS and NMOS. The devices in FIGS. 3B, 3C, and 3D show an intermediate variation of up to about 10% positive for PMOS and 10% negative for NMOS as they have roughly the same W. The device as shown in the layout 308 shows a variation of up to 15% positive for PMOS and 15% negative for NMOS, which represent transistors having a larger W. Similarly, the device as shown in the layout 310 shows a variation of up to 20% positive for PMOS and 20% negative for NMOS as the W is about 1. It can be seen that the lesser variation there is for a poly gate width of 0.1 µm, as shown by white box and circle plot marks. For a poly gate width of 0.24 µm, as shown by black and shaded plot marks, this variation is greater. It is clear that for a particular W, I_Dsat enhancement or degradation is independent of where the portions of the active region has a minor length as long as the overall W is not changed.

Figure 4B:
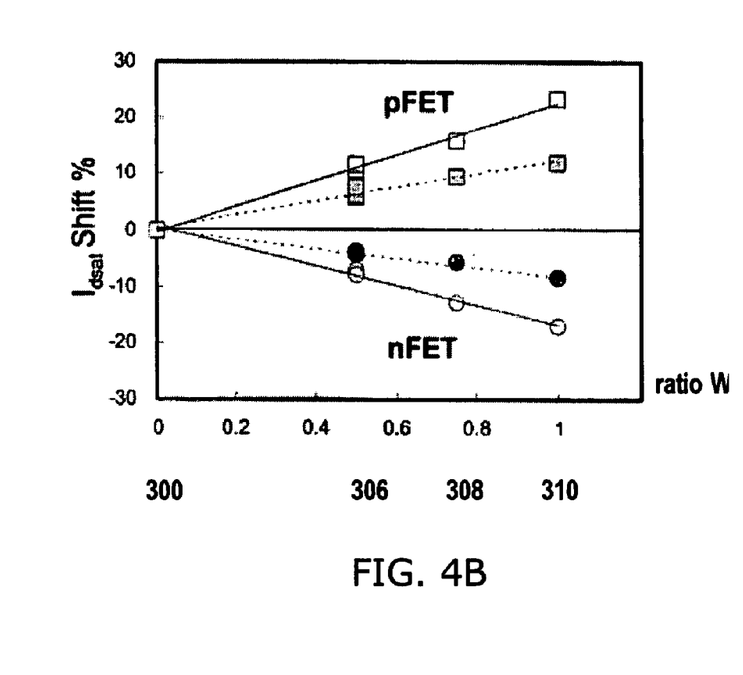

FIG. 4B illustrates the variations of I_Dsat according to various ratios W. In FIG. 4B, the variations of I_Dsat correspond to the design layouts 300, 302, 304, 306, 308, and 310. Specifically, the device as shown in the layout 300 has a ratio W of zero, and the devices as shown in the layouts 3B, 3C, and 3D have a ratio W of 0.5. Furthermore, the device as shown in the layout 308 has a ratio W of 0.75. The device as shown in the layout 310 has a ratio W of 1.0. Here, the variation of I_Dsat is shown to be linear with the ratio W—positive for PMOS and negative for NMOS.

These are hybrid designs because accommodation must be made for electrical contacts to the source and to the drain. At least for PMOS, there can be an advantage to placing the edge of STI close to the gate. The necessity of contacts imposes a large minimum distance there, but, between contacts, the edge of STI can be brought in close to the gate. The greater the percentage of the width of the active region that is close to the gate, the greater the advantage to PMOS performance, however somewhat disadvantageous to NMOS performance.

Figure 5A:
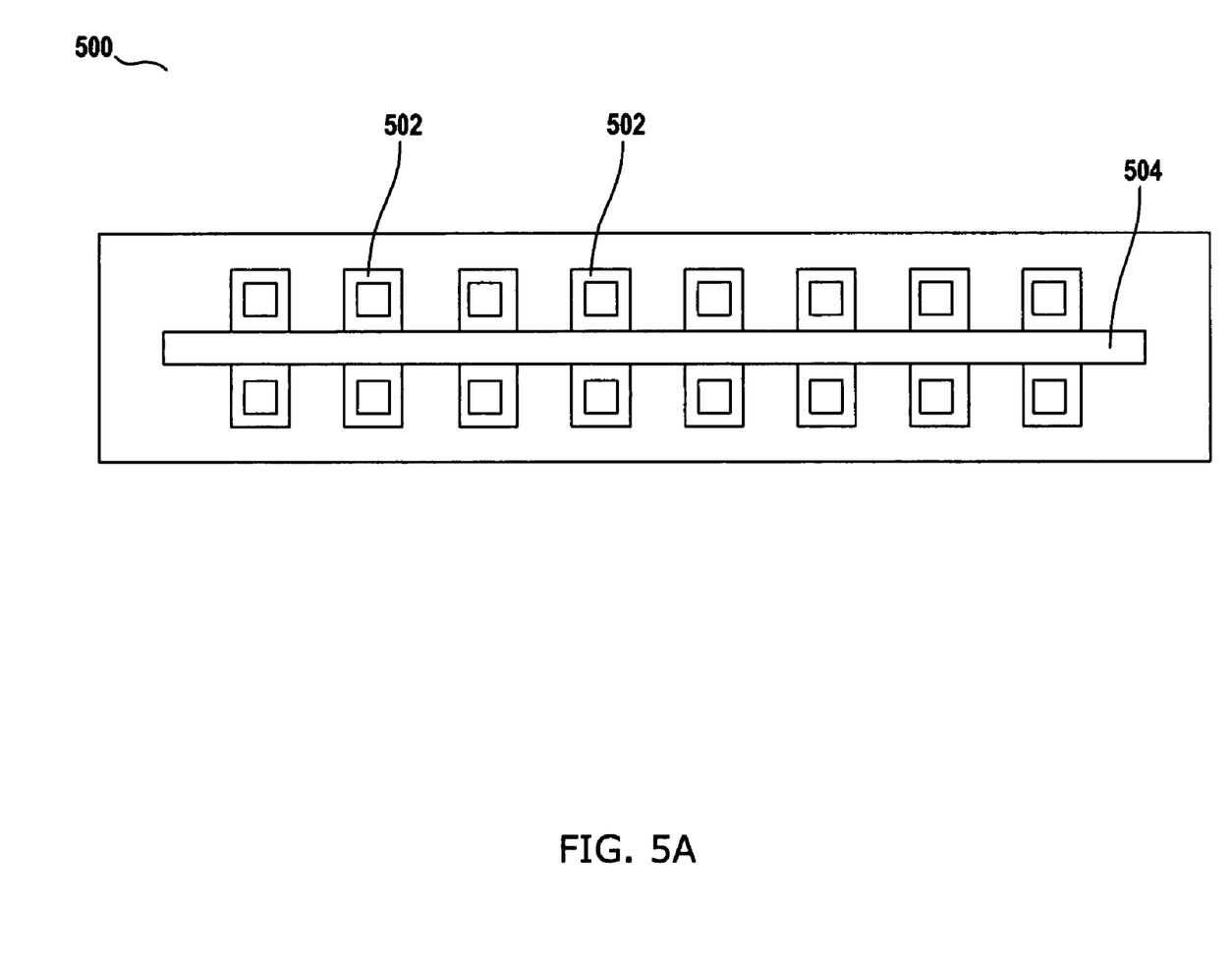

FIG. 5A illustrates a transistor design layout 500 with source/drain isolation cut in accordance with one embodiment of the present invention. Portions of the conventional rectangular active region are now eliminated so that the layout 500 shows a standard cell transistor formed by multiple neighboring narrow active regions 502 with a common gate 504. This increases the total effective W ratio, but retains most of the total DC current capacity, I_Dsat.

Figure 5B:
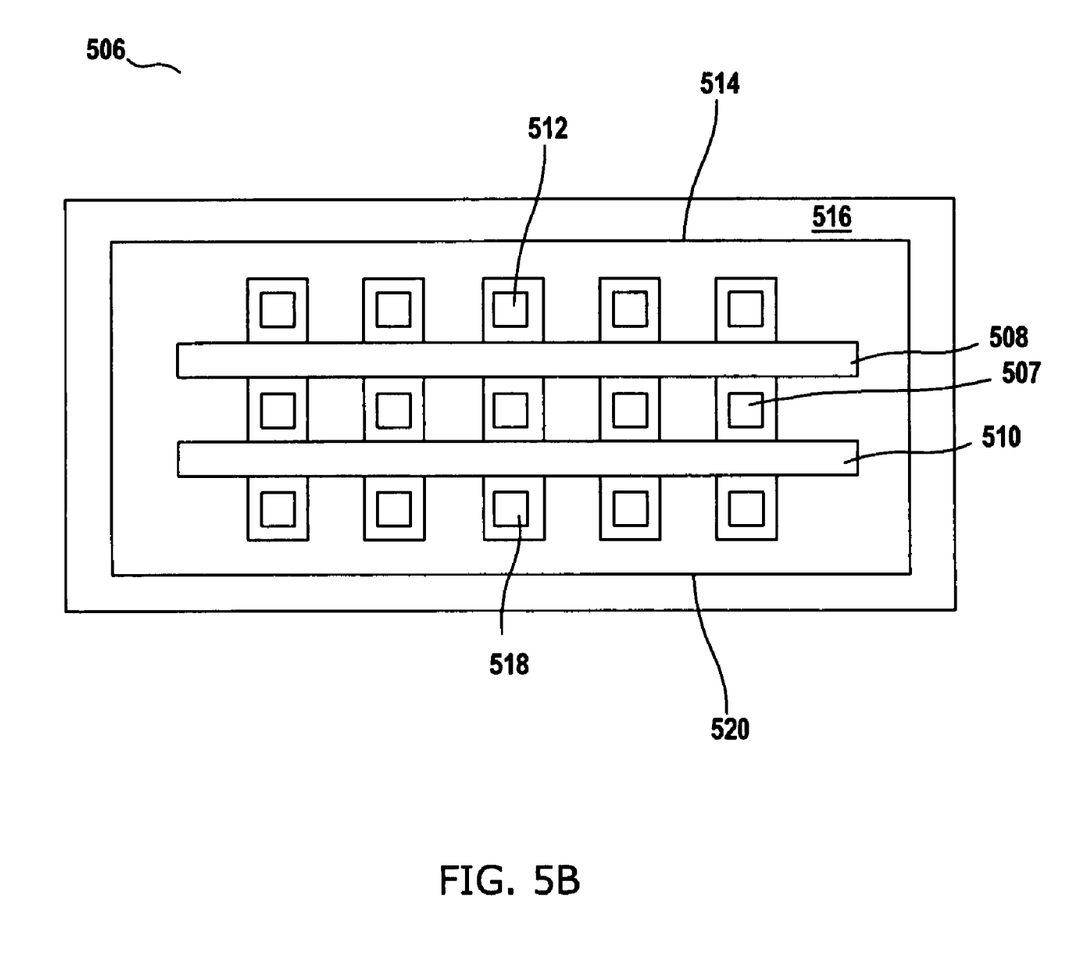

FIG. 5B illustrates a design layout 506 for a transistor with source/drain isolation cut in accordance with one embodiment of the present invention. Assuming the transistor is a PMOS, multiple common source contacts 507 are placed in the middle between a gate 508 and a gate 510. Multiple common drain contacts 512 are placed between the gate 508 and an edge 514 of an STI 516. Multiple common drain contacts 518 are placed between the gate 510 and an edge 520 of the STI 516. This can also be viewed as two transistors coupled together sharing a source/drain region.

Figure 6:
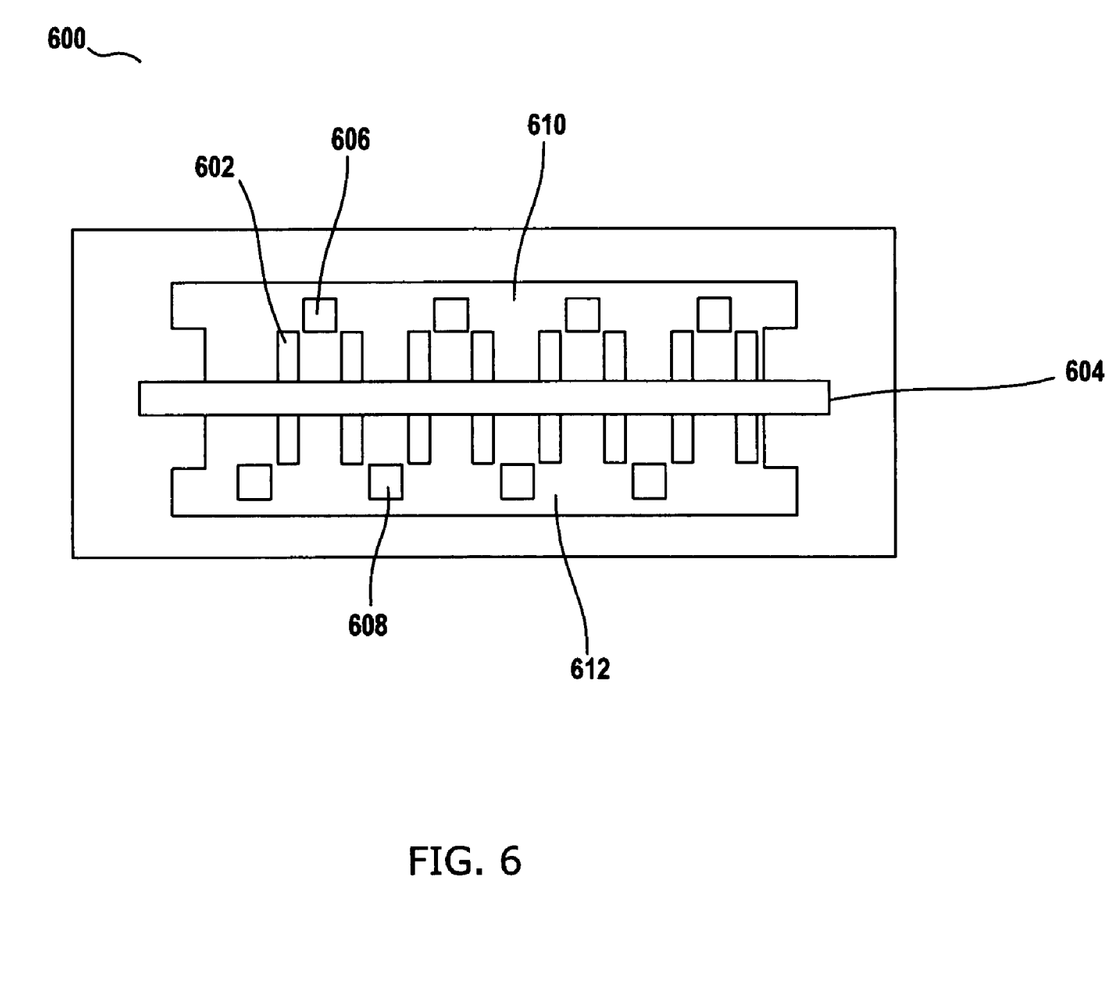

FIG. 6 illustrates a transistor design layout 600 with "gaps" cut in the active region in accordance with one embodiment of the present invention. Multiple small gaps or islands 602 are created under a gate 604. Source contacts 606 as well as drain contacts 608 are provided on active regions 610 and 612, respectively. By introducing additional gaps 602 on the active region and under the gate 604, portions of the active region has a reduced distance from its edge to the edge of the poly gate, thereby improving strained silicon performance.

Figure 7A:
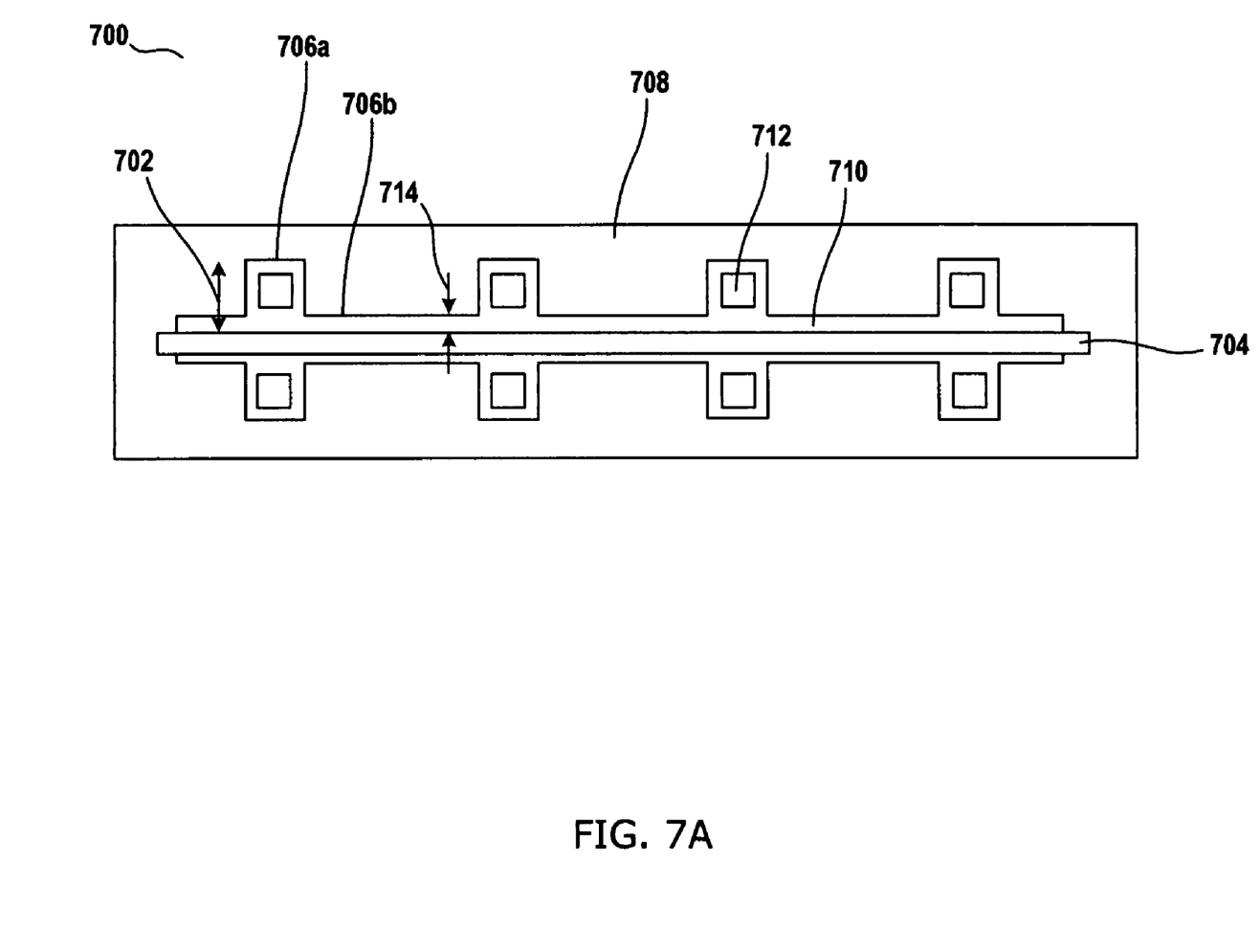

FIG. 7A illustrates a transistor design layout 700 with spaced-apart contacts with the size of the portions of the active region between the contacts reduced in accordance with one embodiment of the present invention. The cut of the source/drain area with optimized contact pitch is specifically designed for a high current capacity. A major distance 702, between a gate 704 and an edge 706a of the active region 710 that borders against a STI 708, provides the space for contacts 712. A minor distance 714, between the gate 704 and an edge 706b of the active region or the STI 708, provides a reduced spacing between the source of the stress, the edge 706b, and the gate 704 to be strained. This pattern of reduced gate-to-active region distances (with an increase of ratio W) provides the advantages of strain from the proximity of a stressing structure while retaining enough contacts for current delivery.

Figure 7B:
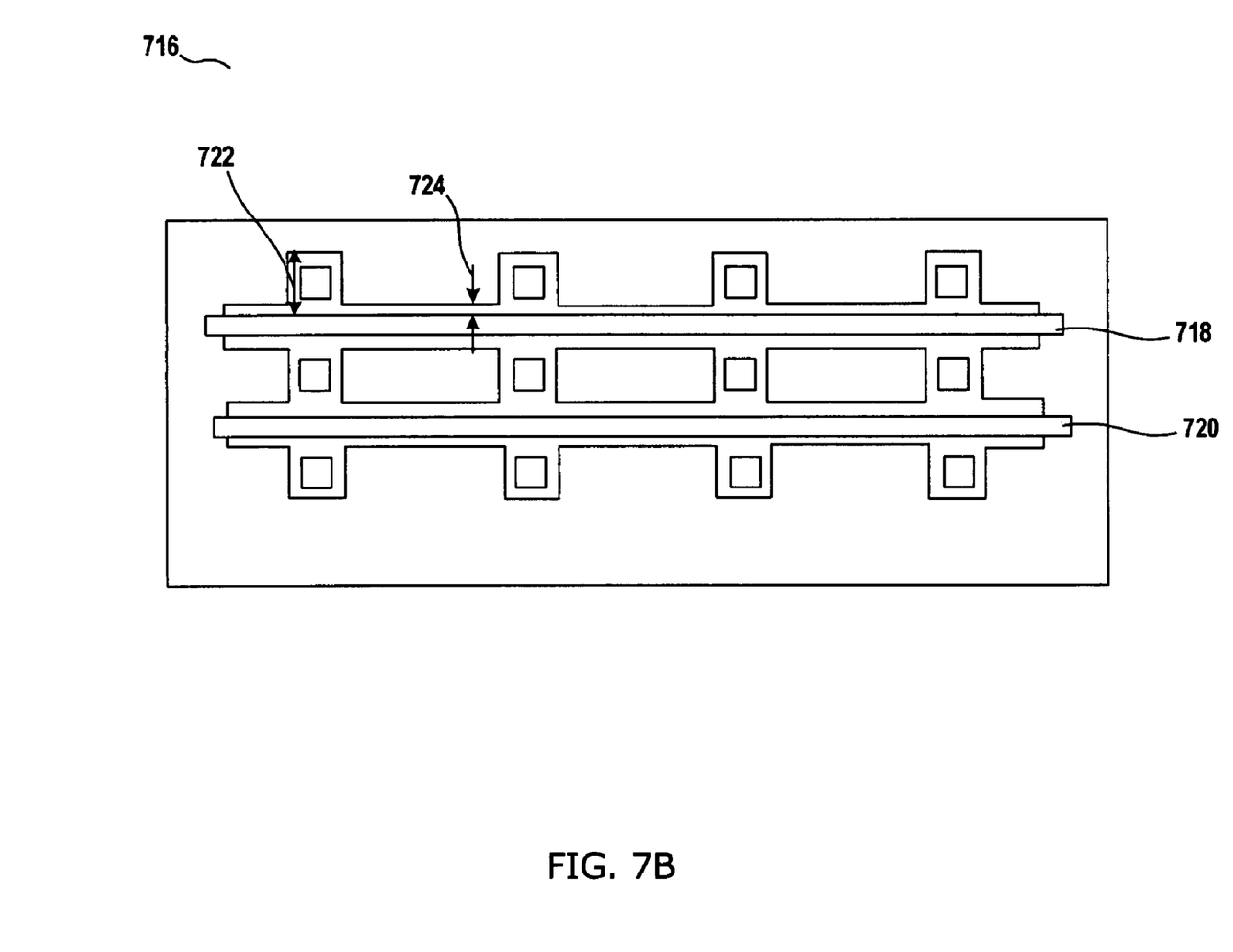

FIG. 7B illustrates a transistor design layout 716 with spaced apart contacts similar to FIG. 7A. If it is a single standard cell transistor, the gate is separated into two portions 718 and 720 in parallel. The gate portions 718 and 720 are as though two layouts 700 are stacked adjacent to each other, with shared drains/sources that are situated between the two gate portions 718 and 720. Here, similar to the one depicted in FIG. 7A, additional reduced distances between the edges of the gate and the active region (e.g., with minor distance 724) provide additional strained silicon benefits, while the major distances 722 provide enough space for contact placement. From another perspective, this layout can also be viewed as two separate transistors coupled together to share the source/drain region.

Figure 8:
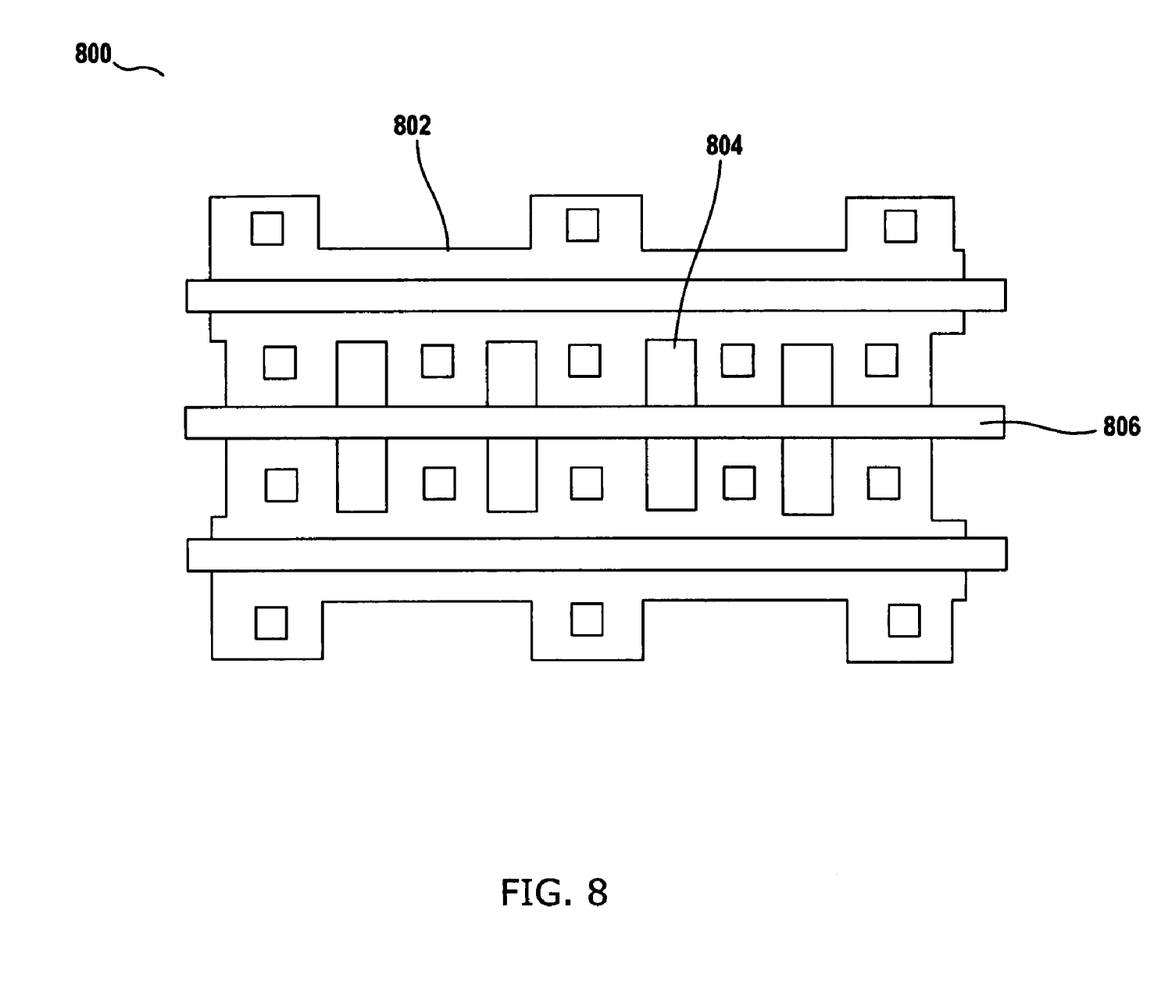

FIG. 8 illustrates a transistor design layout 800 with a combination of the layouts described above in accordance with another embodiment of the present invention. The combination structure shows a cut of the source/drain area 802, as shown in FIG. 7A, and an insertion of various gaps 804 in the active region across a gate 806, as shown in FIG. 6. Depending how the contacts are coupled, this transistor can be viewed as two transistors coupled in series or in parallel.

Figure 9:
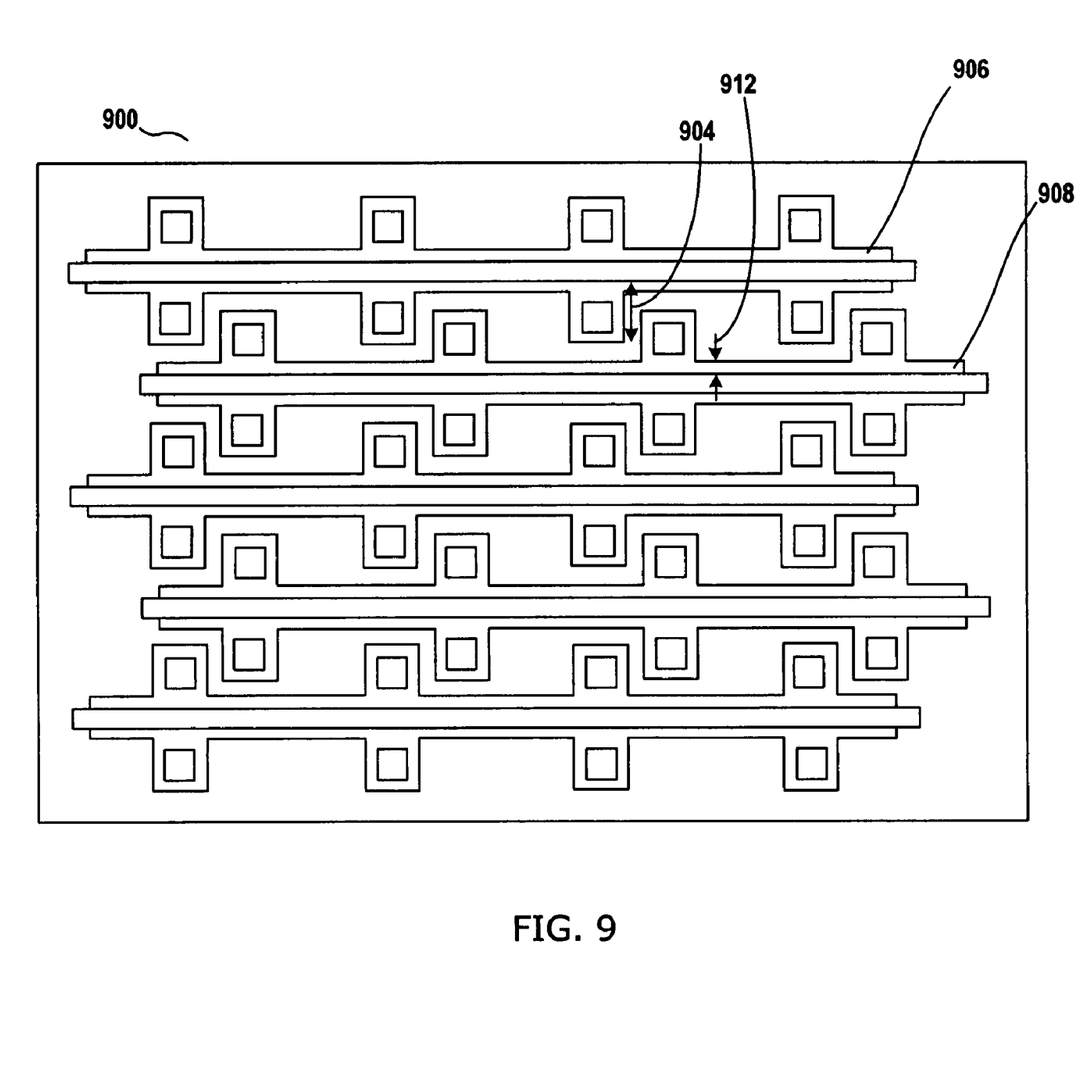

FIG. 9 illustrates a space-saving layout 900 of the new designs in accordance with one embodiment of the present invention. Here, the portion of the active region for a transistor 906 with a major distance 904, that allows space for at least a contact, can be shifted into the space created in another transistor 908 (by removing portions of the active region) which has a minor distance 912. By tiling these similarly shaped transistors together with such a lateral shift, significant space advantages can be achieved while creating a minor distance 912 that provides the advantages as presented in this invention since each transistor enjoys an increased ratio W. As shown, the portion of the active region with a major distance now fits into the space between two portions of the active region with a major distance of another layout so that they are laterally next to each other, thereby saving the layout space. In practice, for the convenience of layout design, the two transistors 908 and 906 can be of exactly the same configuration in terms of its physical dimensions. It is also noticed that there is a gap between the two transistor layouts so that they are isolated from each other although they can be connected through contact designs.

Figure 10:
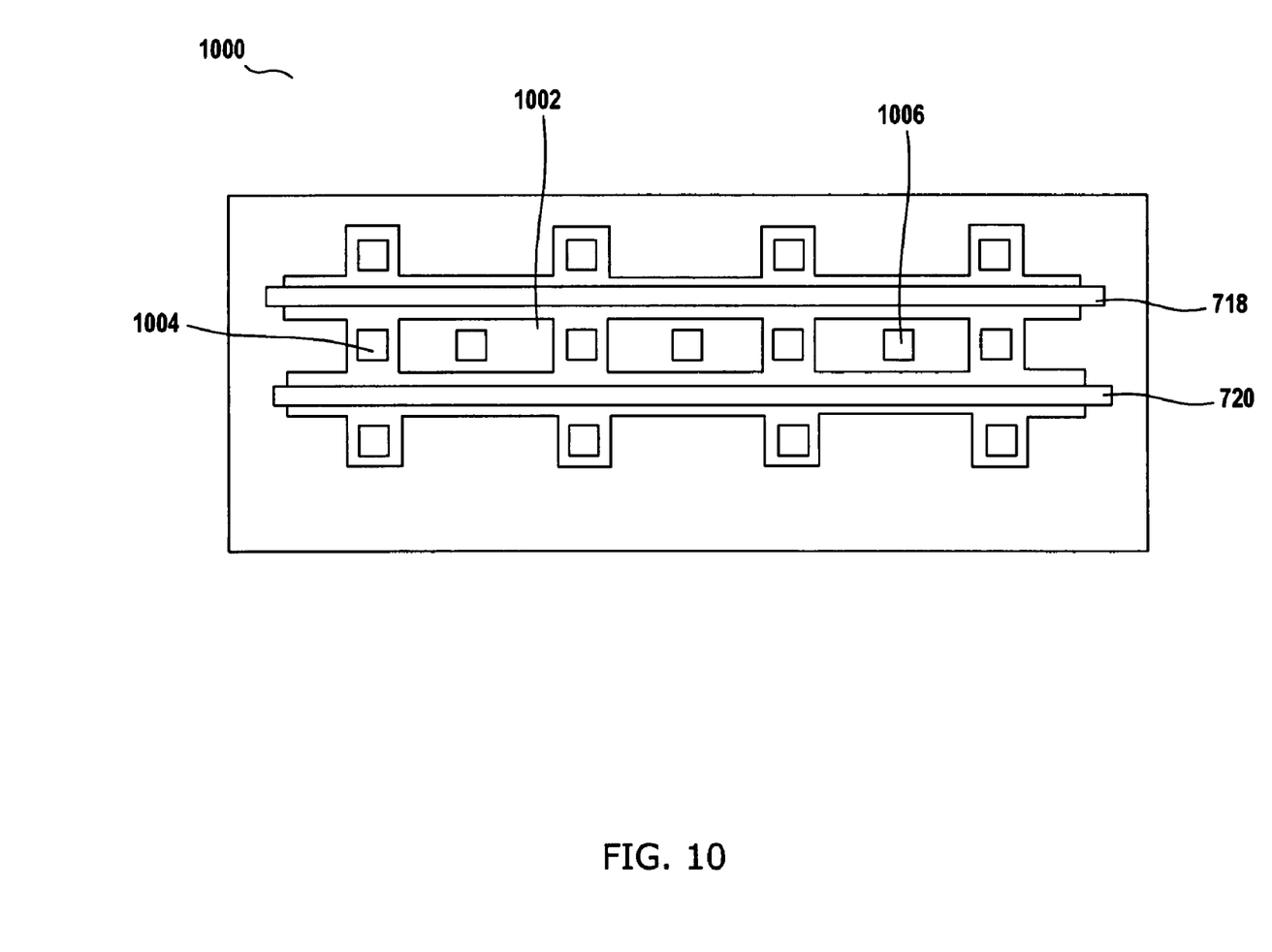

FIG. 10 illustrates a transistor design layout 1000 in accordance with one embodiment of the present invention. The layout 1000 is an improvement of the layout 716 through the use of multiple gaps 1002, which are produced between the gates 718 and 720. Multiple source/drain contacts 1004 are produced between the gates 718 and 720. Here, substrate pickup contacts 1006 are produced within and through the gaps 1002. The additional portions of the active region with reduced gate-to-active region distance increase the ratio W, thereby increasing the strained characteristics of the strained silicon in accordance with the present invention.

The above illustration provides many different embodiments or embodiments for implementing different features of the invention. Specific embodiments of components and processes are described to help clarify the invention. For example, many of the embodiments shown above show a symmetrical layout, but in practice, they may not be perfectly symmetrical. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A layout for a transistor of a standard cell comprising:
   an active region with at least one portion having a first edge and at least one portion having a second edge all perpendicular to a channel of the transistor; and
   at least one gate placed on top of the active region with a distance from an edge of the gate to the first edge being shorter than a distance from the edge of the gate to the second edge of the active region,
   wherein the active region is of a non-rectangular shape,
   wherein a ratio of a width of the first edge to a width of the sum of the first and the second edges is at least 0.5.

2. The layout of claim 1 further comprising one or more contacts placed in the portion having the second edge.

3. The layout of claim 1, wherein the portion having the first edge is eliminated so that the active region is broken into isolated portions having the second edge with contacts placed thereon.

4. The layout of claim 1, wherein the portion having the first edge is not under the gate so that a gap in the active region is created underneath the gate.

5. The layout of claim 1, wherein the portion having the first edge is directly underneath the gate.

6. A layout for a transistor of a standard cell comprising:
an active region with at least one portion having a first edge and at least one portion having a second edge all perpendicular to one or more channels of the transistor;
a first gate overlying the active region, having a first distance from an longitudinal edge of the gate to the first edge of the portion short than a second distance from the longitudinal edge of the gate to the second edge of the portion; and
a second gate overlying the active region in parallel with the first gate, having a third distance from an longitudinal edge of the gate to the first edge of the portion short than a fourth distance from the longitudinal edge of the gate to the second edge of the portion,
wherein the active region is of a non-rectangular shape, wherein at least one gap in the active region is formed between the first and second gates and at least one substrate pickup contact is formed in the gap.

7. The layout of claim 6 further comprising one or more contacts placed in the portion having the second edge.

8. The layout of claim 6, wherein a ratio of a total width of the first edge to a total width of the sum of the first and the second edges is no smaller than 0.5.

9. The layout of claim 6, wherein at least one gap in the active region is formed between two channels.

10. A layout for transistors using a standard cell comprising:
a first transistor layout having:
a first active region with at least one portion having a first edge and at least one portion having a second edge all perpendicular to a channel of the first transistor; and
a first gate placed on top of the first active region with a first distance from a longitudinal edge of the first gate to the first edge being shorter than a second distance from the longitudinal edge of the first gate to the second edge of the first active region;
a second transistor layout placed in parallel with the first transistor layout having:
a second active region with at least one portion having a third edge and at least one portion having a fourth edge all perpendicular to a channel of the second transistor; and
a second gate placed on top of the second active region with a third distance from a longitudinal edge of the second gate to the third edge being shorter than a fourth distance from the longitudinal edge of the second gate to the fourth edge of the second active region,
wherein the second transistor layout is shifted so that the portion having the fourth edge is placed laterally next to the portion having the second edge of the first transistor layout,
wherein the second edge and the fourth edge are disposed between the first and second gates.

11. The layout of claim 10 further comprising one or more contacts placed in the portion having the second edge or the fourth edge for the first or second transistor layout.

12. The layout of claim 10, wherein, for the first transistor layout, a ratio of a total width of the first edge to a total width of the sum of the first and the second edges is bigger than 0.

13. The layout of claim 10, wherein at least one gap is formed between the first and second active regions.

14. The layout of claim 10, wherein the first and second transistors are of the same configuration.

* * * * *